United States Patent [19]

Hori et al.

[11] Patent Number: 5,274,657
[45] Date of Patent: Dec. 28, 1993

[54] PHASE LOCK TYPE SEMICONDUCTOR LASER

[75] Inventors: Yoshikazu Hori, Tokyo; Fumihiro Sogawa, Osaka, both of Japan

[73] Assignee: Matsushita Electric Industrial Co., Ltd., Osaka, Japan

[21] Appl. No.: 894,322

[22] Filed: Jun. 4, 1992

[30] Foreign Application Priority Data

Jun. 10, 1991 [JP] Japan .................. 3-136894

[51] Int. Cl.$^5$ ............................................. H01S 3/19
[52] U.S. Cl. .................................. 372/50; 372/96; 372/97; 372/99; 372/102; 372/92; 372/20
[58] Field of Search .......... 372/50, 96, 97, 99, 372/102, 92, 20

[56] References Cited

U.S. PATENT DOCUMENTS 4,913,525  4/1990  Asakura et al. .................. 372/102
5,115,444  5/1992  Kirkby et al. .................... 372/50

*Primary Examiner*—Georgia Y. Epps
*Attorney, Agent, or Firm*—Lowe, Price, LeBlanc & Becker

[57] ABSTRACT

A phase lock type semiconductor laser comprising: an array type semiconductor laser main body which includes a plurality of line-shaped active layers having wave guides disposed in parallel with each other, these active layers having waveguide modes optically coupled with each other, and a reflection-type light diffraction element executing a light return or feedback in such a manner that only a specific wavelength beam among emitted beams of coupling modes which are emitted from one end surface of the semiconductor laser main body in terms of a line-shaped light source can be directly focused on the same one end surface of the semiconductor laser main body in a line-shaped.

8 Claims, 3 Drawing Sheets

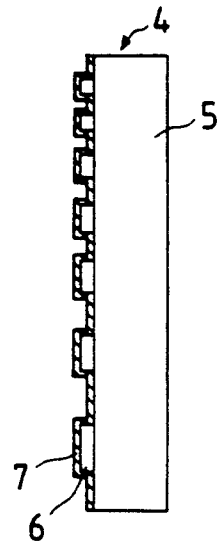
FIG. 3
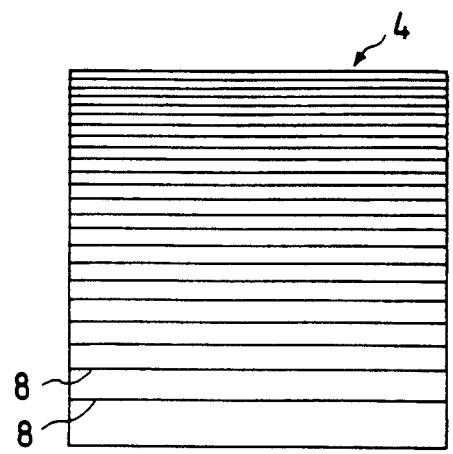
FIG. 4
FIG. 5
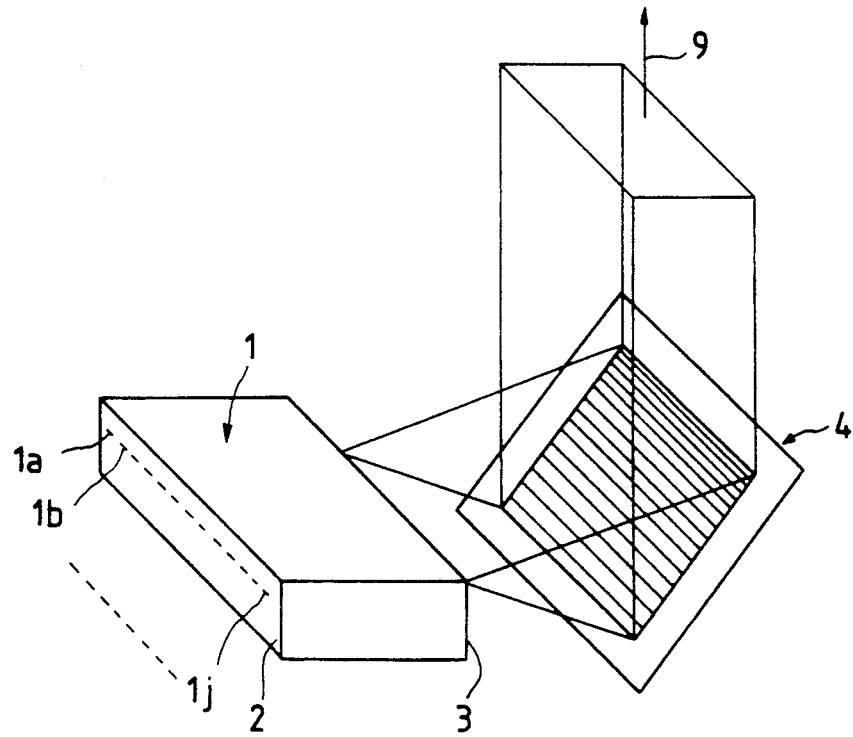

PHASE LOCK TYPE SEMICONDUCTOR LASER

BACKGROUND OF THE INVENTION

1. Field of the Invention

The present invention relates to a field of an optical communication which transmits information by use of a semiconductor laser or a field of an optical recording which executes recording and/or reproducing of information, and more particularly to a semiconductor laser having a stable wavelength and a large power.

2. Description of the Prior Art

A semiconductor laser has been performing an important role as a small-sized light source in the optical communication field or the optical recording field. And, recently, an output of the semiconductor laser is required to further increase more and more. Especially, in the case where the semiconductor laser is utilized as a light source of an optical disk capable of erasing its recorded memory, a high-power semiconductor laser which can focus to a diffraction limit becomes necessary.

Conventionally, in order to realize a power-up of the semiconductor laser, many approaches have been tried. These approaches are chiefly classified into three categories. First one is characterized by a method for improving a wave guide structure of a semiconductor laser having a usual single-transverse mode. Second one is characterized by a method for increasing light-emitting area by expanding a stripe width of an active layer; i.e. a method for manufacturing a so-called broad area type semiconductor laser. And, third one is characterized by a method for constituting an array of a plurality of lasers having modes being coupled with each other; i.e. a method for manufacturing a so-called phase lock type laser.

However, an oscillation output of a conventional single-stripe semiconductor is limited up to approximately several 10 mW, though it has a superior focusing characteristics. Furthermore, its wavelength is varied based on value change of injection current. And, in the case where this conventional single-stripe semiconductor is used in an optical disk system, an aberration is inherently generated due to wavelength dispersion in an optical lens. Therefore, it is earnestly desired to realize a semiconductor laser capable of suppressing wavelength fluctuation as less as possible.

On the other hand, a transverse-mode of the conventional broad area type semiconductor laser is a multiple mode. Therefore, this type semiconductor laser cannot be used in an optical disk system because it is impossible for this broad area type semiconductor laser to focus beam to a diffraction limit.

FIG. 7 shows a typical constitution of a phase lock type semiconductor laser. This phase lock type semiconductor laser includes a plurality of line-shaped active layers 1a, 1b, - - - , 1j having wave guide structures disposed in parallel with each other. And, these active layers 1a, 1b, - - - , 1j are constituted in an array wherein respective wave guide modes are optically coupled with each other.

If all the phases A of beams emitted from end surfaces of respective active layers 1a, 1b, - - - , 1j are uniformly locked, an output B can be highly enhanced. To the contrary, if all the phases A of beams emitted from the end surfaces of respective active layers 1a, 1b, - - - , 1j are not locked, the output B is weakened due to interference.

It is practically impossible to realize a 0-order coupling in which all the phases A are perfectly coherent. Especially, if an array number is increased to obtain a higher output, a realization of the 0-order coupling becomes further difficult.

Moreover, even if the 0-order coupling can be realized under a limited condition, this 0-order coupling is easily deteriorated since it is influenced by change of injection current value and fluctuation of circumferential temperature. For example, a propagation constant of each wave guide is varied by the change of injection current value and the fluctuation of circumferential temperature. Therefore, it is impossible to focus beams to the diffraction limit.

Accordingly, a semiconductor laser having a property suitable for a light source of the optical disk has not been realized yet.

SUMMARY OF THE INVENTION

The present invention has a purpose, in view of above problems and disadvantages encountered in the conventional art, to provide a semiconductor laser capable of overcoming such problems and disadvantages and having a large and stable wavelength, and further capable of focusing beams to a diffraction limit.

To accomplish this purpose, a first aspect of the present invention provides a phase lock type semiconductor laser comprising: an array type semiconductor laser main body which includes a plurality of line-shaped active layers having wave guides disposed in parallel with each other, said active layers having waveguide modes optically coupled with each other, and a reflection-type light diffraction element executing a light return or feedback in such a manner that only a specific wavelength beam among emitted beams of coupling modes which are emitted from one end surface of said semiconductor laser main body in terms of a line-shaped light source can be directly focused on said one end surface of said semiconductor laser main body in a line-shaped.

A second aspect of the present invention provides a phase lock type semiconductor laser in accordance with the first aspect of the present invention in which said light diffraction element is constituted by forming diffraction gratings on a flat substrate.

A third aspect of the present invention provides a phase lock type semiconductor laser in accordance with the second aspect of the present invention in which periods of said diffraction gratings on the flat substrate vary continuously.

A fourth aspect of the present invention provides a phase lock type semiconductor laser in accordance with the third aspect of the present invention in which said diffraction gratings are a group of lines extending in an X-direction which are defined by the following equation.

$$(y - f \cdot \sin \Theta)^2 = (M \cdot (m \cdot \phi/2) + f)^2 - (f \cdot \cos \Theta)^2$$

wherein, a flat surface of the flat substrate is defined by an X-axis and a Y-axis mutually crossing perpendicularly; and y, f, $\Theta$, and $\phi$ are variables defined in such a manner that y is a value of Y-axis, and f is a distance between the end surface of the active layer and an origin of the X-Y coordinates, and $\Theta$ is an angle between the Y-axis and a line connecting the end surface of the active layer and the origin of the X-Y coordinates, and further φ is a wavelength of said returned specific beam; and M and m are integers.

A fifth aspect of the present invention provides a phase lock type semiconductor laser in accordance with the first aspect of the present invention in which said light diffraction element is constituted in such a manner that a laser beam emitted from the active layer of said one end surface of the semiconductor laser main body and having an oscillation wavelength adjacent to said specific wavelength can be focused at an outside of said active layer.

A sixth aspect of the present invention provides a phase lock type semiconductor laser in accordance with the first aspect of the present invention in which said one end surface of the semiconductor laser main body is formed with an anti-reflection film.

A seventh aspect of the present invention provides a phase lock type semiconductor laser comprising: an array type semiconductor laser main body which includes a plurality of line-shaped active layers having wave guides disposed in parallel with each other, said active layers having waveguide modes optically coupled with each other, and a reflection-type light diffraction element being constituted by straight diffraction gratings formed on a flat substrate, said light diffraction element executing a light return or feedback in such a manner that only a specific wavelength beam among emitted beams of coupling modes which are emitted from one end surface of said semiconductor laser main body in terms of a line-shaped light source can be directly focused on said one end surface of said semiconductor laser main body in a line-shaped by virtue of 2-order diffraction effect, and a 1-order diffraction beam can be prevented from focusing on said one end surface of said semiconductor laser main body.

And, an eighth aspect of the present invention provides a phase lock type semiconductor laser in accordance with the seventh aspect of the present invention in which said diffraction gratings are a group of lines extending in an X-direction which are defined by the following equation.

$$(y - f\sin\Theta)^2 = (m\cdot\phi + f)^2 - (f\cos\Theta)^2$$

wherein, a flat surface of the flat substrate is defined by an X-axis and a Y-axis mutually crossing perpendicularly; and y, f, Θ, and φ are variables defined in such a manner that y is a value of Y-axis, and f is a distance between the end surface of the active layer and an origin of the X-Y coordinates, and Θ is an angle between the Y-axis and a line connecting the end surface of the active layer and the origin of the X-Y coordinates, and further φ is a wavelength of said returned specific light; and m is an integer.

The present invention is based on the following mechanism. That is, a wave front of the 0-order coupling phase locked mode beam emitted from the end surface of a semiconductor laser main body is an emitted wave front from the line-shaped light source. This fact is utilized in focusing only a specific wavelength beam among beams emitted from one end surface of the semiconductor laser main body so as to focus on the same end surface in a line-shaped by virtue of diffraction effect of a diffraction gratings of a special configuration.

Thus, only limited beams respectively having the same wave front are returned so that laser oscillation of 0-order coupling phase locked mode can be generated.

That is, as shown in FIG. 6, a beam C having a different wavelength is focused on a point E belonging to a non-active portion D after having reflected by the light diffraction element 4. Therefore, this beam C is not returned. Moreover, another modes other than the 0-order coupling phase locked mode are not sufficiently focused on the end surface of the active layer due to aberration of the diffraction element, since these modes have different emitted wave fronts. Therefore, an efficiency of the light return or feedback is lowered. Consequently, a laser oscillation of 0-order coupling mode and having a specific wavelength can be realized.

Still further, by utilizing a 2-order diffraction phenomenon for the light return or feedback in accordance with the present invention, it becomes possible not only to cause laser oscillation of 0-order coupling mode having a specific wavelength but to realize a collimated beam source since its 1-order diffraction beams are emitted toward the outside as collimated beams.

The above and other objects, features and advantages of the present invention will become more apparent from the following detailed description which is to be read in conjunction with the accompanying drawings.

BRIEF DESCRIPTION OF THE DRAWINGS

FIG. 3 is a cross-sectional view showing a light diffraction element in accordance with the present invention;

FIG. 4 is a plane view showing the light diffraction element in accordance with the present invention;

FIG. 5 a view showing a constitution of a phase lock type semiconductor laser in accordance with a second embodiment of the present invention;

DETAILED DESCRIPTION OF THE PREFERRED EMBODIMENTS

Figure 1:
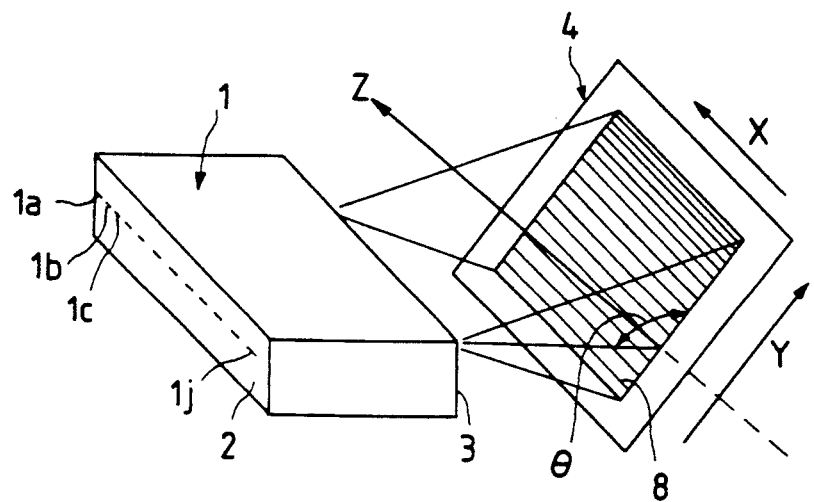
FIG. 1 is a view showing a constitution of a phase lock type semiconductor laser in accordance with a first embodiment of the present invention.

Hereinafter, referring now to the accompanying drawings, embodiments of the present invention are explained in detail,

FIRST EMBODIMENT

A first embodiment of the present invention is explained in detail with reference to FIGS. 1 through 4. In the drawings, a semiconductor laser main body 1 is a Fabry-Pérot type semiconductor laser array having a substrate made of gallium arsenide and a plurality of active layers having a width of 0.8 μm and made of aluminum gallium arsenide. Reference numerals 1a, 1b, - - - , 1j denote stripe-shaped active regions (laser stripes).

A clearance between respective laser stripes is 5 μm. These laser stripes have transverse modes being optically coupled with each other.

A reflection-type light diffraction element 4 is constituted by a flat substrate 5 and a plurality of diffraction gratings. These diffraction gratings are disposed in such a manner that periods of the diffraction gratings gradually and continuously vary.

The semiconductor laser main body 1 has end surfaces 2 and 3. Laser beams are emitted from the end surface 3. And, the reflection-type light diffraction element 4 is constituted in such a manner that a laser beam having a wavelength of 0.8 μm is, after having been emitted from the end surface 3 and refracted by the light diffraction element 4, directly returned to the end surface 3 so as to focus on the same active layer of the end surface 3 in a line shaped by virtue of light diffraction effect of the light diffraction element 4.

The end surface 3 of the semiconductor laser main body 1 is attached with an anti-reflection film so that an oscillation by the Fabry-Pérot oscillator formed by the both end surfaces of the semiconductor laser main body 1 itself can be suppressed.

Figure 6:
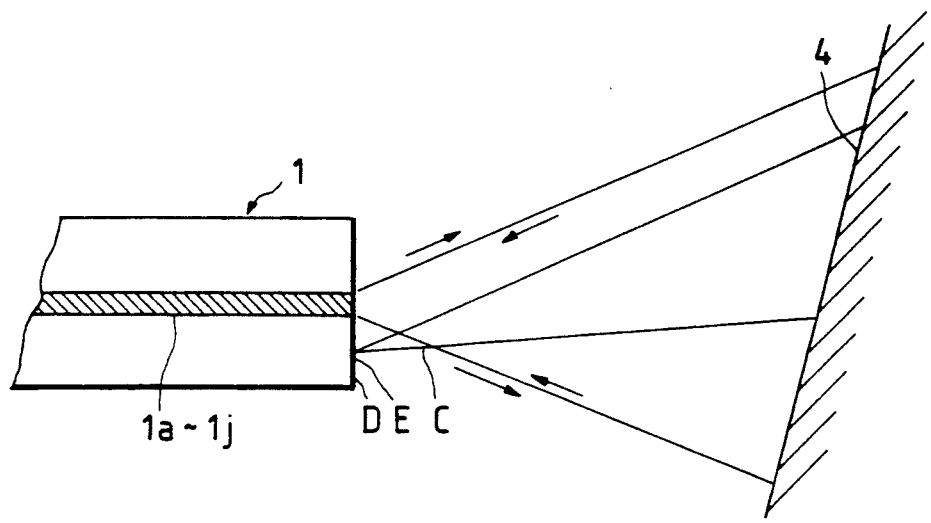
FIG. 6 is an explanatory view showing function of the present invention.
Figure 7:
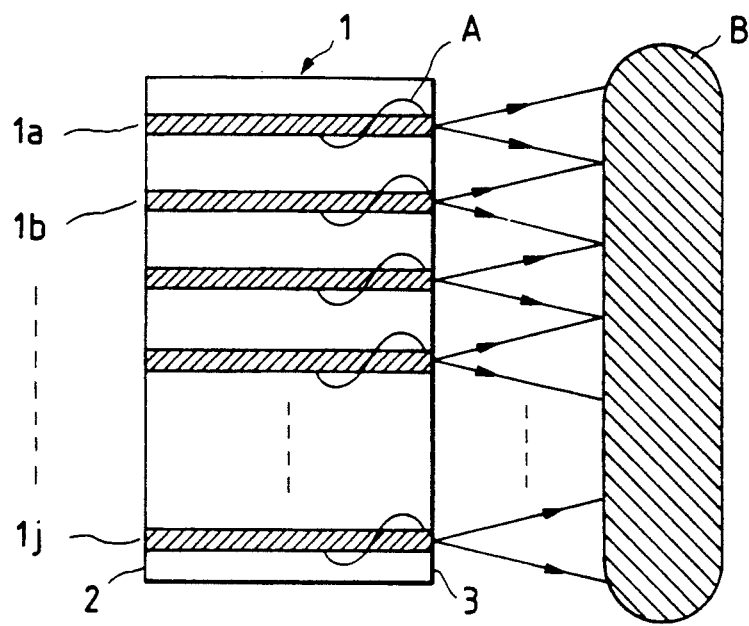
FIG. 7 is a view showing a typical constitution of an array shaped semiconductor laser main body.

Furthermore, the diffraction element 4 is further designed in such a manner that a laser beam having a wavelength of an adjacent auxiliary mode, which is likely to oscillate due to the Fabry-Pérot mode of the semiconductor laser main body 1 itself, is focused on the position E shown in FIG. 6 which is spaced from the active layer approximately 2 μm.

Laser beams emitted from the other end surface 2 of the semiconductor laser main body 1 can be utilized, for example, as a light source of an optical recording system by converting them into collimated beams through cylindrical lens etc. and, in turn, focused onto a surface of an optical disk.

Figure 2:
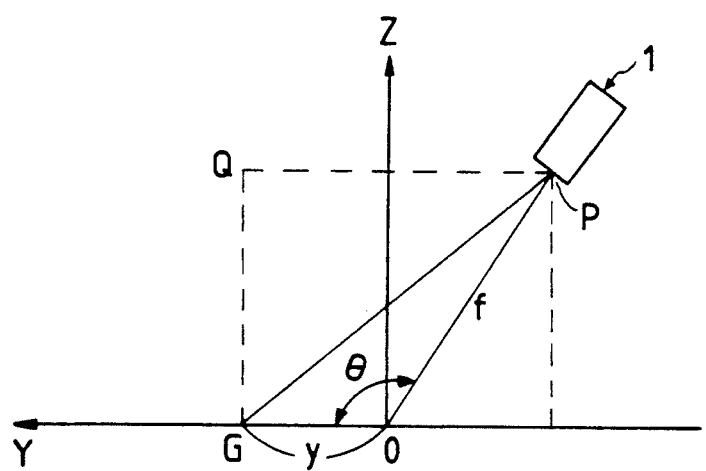
FIG. 2 is an explanatory view showing a principle of a light diffraction element used for the phase lock type semiconductor laser in accordance with the present invention and its configuration.

A design principle of the light diffraction element 4 is explained hereinafter with reference to FIG. 2.

In designing, it is supposed the laser beams are emitted from line-shaped light sources so that they are uniformly emitted in an X-direction. Therefore, the designing is carried out by only taking a Z-Y plane into consideration.

A Y-axis is defined on a flat substrate on which the diffraction element is formed. An end surface P of the active layer, which becomes both a divergent point and a focus point of laser beam, is positioned on a line crossing the origin O at an angle of Θ degrees with respect to the Y-axis. And, a distance from the origin O to the position P is defined as f.

If the shape of diffraction gratings are designed in such a manner that coherent laser beams emitted from the point P reach one of gratings point (i.e. point G) on the diffraction element 4 and, in turn, reflected to directly return to the same point P, this diffraction element serves as an external resonator mirror.

That is, if it is supposed that the point G is considered as a specific phase point of the diffraction grating, the shape of the diffraction grating is defined by the following equations.

$$2 \cdot PG = m \cdot \phi + 2 \cdot PO$$

wherein, $\phi$ denotes one of a plurality of setting oscillation wavelengths of the semiconductor laser main body, and m is an integer which shows a number of a diffraction grating from the origin. Furthermore, $$(y - f \sin \Theta)^2 = (M \cdot (m \cdot \phi/2) + f)^2 - (f \cos \Theta)^2 \quad (1)$$

wherein, a flat surface of the flat substrate is defined by an X-axis and a Y-axis mutually crossing perpendicularly; and y, f, Θ, and $\phi$ are variable defined in such a manner that y is a value of Y-axis, and f is a distance between the end surface of the active layer and an origin of the X-Y coordinates, and Θ is an angle between the Y-axis and a line connecting the end surface of the active layer and the origin of the X-Y coordinates, and further $\phi$ is a wavelength of said returned specific beam; and M is an integer showing which order of the diffraction beam is returned to the semiconductor laser main body 1.

In the case where a 1-order coupling diffraction laser beam is returned to the semiconductor laser main body 1, a value of M becomes 1. Therefore, equation (1) is expressed as follows.

$$(y - f \sin \Theta)^2 = ((m \cdot \phi/2) + f)^2 - (f \cos \Theta)^2 \quad (2)$$

FIGS. 3 and 4 show schematic views of the light diffraction element 4.

First of all, a concavo-convex shape (shown in FIG. 3) of the light diffraction element 4 is manufactured by irradiating electron beam on a silicon substrate 5 onto which electron beam resists 6 are formed and, subsequently, dipping it into developing liquid so as to remove the irradiated portion.

Next, a metallic film 7 is coated on the concavo-convex surface of the electron beam resist so that diffraction gratings 8, 8 - - - having higher reflection ratio can be formed.

FIG. 4 is a schematic view showing the diffraction gratings formed in such a manner by the electron beam. The diffraction element is formed in an area of 0.05×0.1 cm². If the setting parameters in case of "M=1" are supposed as f=2 mm, Θ=48.2°, and $\phi$=0.8 μm, above equation (2) is expressed by the following equation (3).

$$y = F(m) \quad (3)$$

Accordingly, each position of the diffraction gratings is determined as a function of parameter m.

It was shown that, when the light diffraction grating 4 constituted as described above was used as an external resonator mirror in the phase lock type semiconductor laser, an oscillation of 0-order coupling mode having approximately 0.8 μm wavelength could be generated.

Furthermore, it was confirmed that, even though injection current was changed, oscillation wavelength or oscillation mode were not varied. And also, a higher output more than 100 mW could be easily obtained.

Moreover, the oscillation wavelength could be continuously controlled within a range from an approximately 0.78 μm to an approximately 0.82 μm by adjusting an angle formed between the substrate of the semiconductor laser 1 and the light diffraction element 4.

SECOND EMBODIMENT

This embodiment is different from the first embodiment in that the diffraction gratings formed on the light diffraction element 4 are different from those of the first embodiment. The shape of the diffraction gratings are defined by the following equation so as to return a 2-order diffraction beam to the semiconductor laser main body 1. That is, in order to realize this, the value M becomes 2 and above equation (1) becomes the following equation (4).

$$(y - f \sin \Theta)^2 = (m\phi + f)^2 - (f \cos \Theta)^2 \quad (4)$$

Then, the laser beam of a predetermined 0.8 μm wavelength, having been emitted from the one end surface 3 of the semiconductor laser main body 1, is directly returned to the same end surface 3 to focus in a line-shape.

Furthermore, the laser beam having a wavelength of an adjacent auxiliary mode, which is likely to oscillate due to the Fabry-Pérot mode of the semiconductor laser main body 1 itself, is focused on the position E shown in FIG. 6 which is spaced from the active layer approximately 2 μm.

Then, 1-order diffraction beams are emitted as collimated beams 9 toward a direction normal to the surface of the semiconductor laser 1. These collimated beams 9 can be easily focused to the diffraction limit by means of a convex lens etc., thus it is possible to apply these collimated beams 9 to the optical recording apparatus.

Though above embodiments adopt a semiconductor laser main body 1 having a substrate made of gallium arsenide and a plurality of active layers having a 0.8 μm width and made of aluminum gallium arsenide, it is apparent that the same effect can be obtained even if an active layer having 0.6 μm width and made of aluminum gallium indium phosphorus is adopted, or even if a semiconductor laser main body having a substrate made of indium phosphorus and a plurality of active layers having a 1.3 μm or 1.5 μm width and made of indium gallium arsenide phosphorus is adopted.

As is apparent from the foregoing description, in accordance with the present invention, by virtue of diffraction effect of special configuration of the diffraction gratings formed on the light diffraction grating element, only a laser beam which is a wave front emitted from a line-shaped light source on an end surface of the semiconductor laser main body and has a specific wavelength is returned to the same end surface of the semiconductor laser to focus in a line-shape.

Thus, the light return or feedback of only the mode having above specific wave front can be realized. And, since a laser oscillation by the phase locked mode of 0-order coupling is caused, it becomes possible to realize a higher output laser oscillation of 0-order coupling mode having a specific wavelength.

Furthermore, by utilizing 2-order diffraction phenomenon in order to attain the light return or feedback, it becomes possible not only to realize a higher output laser oscillation of 0-order coupling mode having a specific wavelength but to realize collimated beam source.

Accordingly, problems and disadvantages of the high power semiconductor laser encountered in the conventional art can be overcome. The realization of a semiconductor laser capable of focusing beams to the diffraction limit brings great practical merits.

As this invention may be embodied in several forms without departing from the spirit of essential characteristics thereof, the present embodiments are therefore illustrative and not restrictive, since the scope of the invention is defined by the appending claims rather than by the description preceding them, and all changes that fall within meets and bounds of the claims, or equivalence of such meets and bounds are therefore intended to embraced by the claims.

What is claimed is:

1. A phase lock type semiconductor laser comprising: an array type semiconductor laser main body which includes a plurality of line-shaped active layers having wave guides disposed in parallel with each other, said active layers having waveguide modes optically coupled with each other, and a reflection-type light diffraction element executing a light return or feedback in such a manner that only a specific wavelength beam among emitted beams of coupling modes which are emitted from one end surface of said semiconductor laser main body in terms of a line-shaped light source can be directly focused on said one end surface of said semiconductor laser main body in a line-shaped.

2. A phase lock type semiconductor laser in accordance with claim 1 in which said light diffraction element is constituted by forming diffraction gratings on a flat substrate.

3. A phase lock type semiconductor laser in accordance with claim 2 in which periods of said diffraction gratings on the flat substrate vary continuously.

4. A phase lock type semiconductor laser in accordance with claim 3 in which said diffraction gratings are a group of lines extending in an X-direction which are defined by the following equation.

$$(y - f \sin \Theta)^2 = (M \cdot (m \cdot \phi/2) + f)^2 - (f \cos \Theta)^2$$

wherein, a flat surface of the flat substrate is defined by an X-axis and a Y-axis mutually crossing perpendicularly; and y, f, Θ, and φ are variables defined in such a manner that y is a value of Y-axis, and f is a distance between the end surface of the active layer and an origin of the X-Y coordinates, and Θ is an angle between the Y-axis and a line connecting the end surface of the active layer and the origin of the X-Y coordinates, and further φ is a wavelength of said returned specific beam; and M and m are integers.

5. A phase lock type semiconductor laser in accordance with claim 1 in which said light diffraction element is constituted in such a manner that a laser beam emitted from the active layer of said one end surface of the semiconductor laser main body and having an oscillation wavelength adjacent to said specific wavelength can be focused at an outside of said active layer.

6. A phase lock type semiconductor laser in accordance with claim 1 in which said one end surface of the semiconductor laser main body is formed with an anti-reflection film.

7. A phase lock type semiconductor laser comprising: an array type semiconductor laser main body which includes a plurality of line-shaped active layers having wave guides disposed in parallel with each other, said active layers having waveguide modes optically coupled with each other and a reflection-type light diffraction element being constituted by straight diffraction gratings formed on a flat substrate, said straight diffraction grating having a shape such that a 2-order diffraction beam of a specific wavelength beam is directly returned to said one end surface of said semiconductor laser main body to focus thereon in a line-shape, while a 1-order diffraction beam is simultaneously reflected as a collimated beam out of said semiconductor laser main body.

8. A phase lock type semiconductor laser in accordance with claim 7 in which said diffraction gratings are a group of lines extending in an X-direction which are defined by the following equation.

$$(y - f \sin \Theta)^2 = (m \cdot \phi + f)^2 - (f \cos \Theta)^2$$

wherein, a flat surface of the flat substrate is defined by an X-axis and a Y-axis mutually crossing perpendicularly; and y, f, Θ, and φ are variables defined in such a manner that y is a value of Y-axis, and f is a distance between the end surface of the active layer and an origin of the X-Y coordinates, and Θ is an angle between the Y-axis and a line connecting the end surface of the active layer and the origin of the X-Y coordinates, and further φ is a wavelength of said returned specific light; and m is an integer.

* * * * *